United States Patent
En et al.

(10) Patent No.: US 6,358,362 B1
(45) Date of Patent: Mar. 19, 2002

(54) METHODS AND ARRANGEMENTS FOR DETERMINING AN ENDPOINT FOR AN IN-SITU LOCAL INTERCONNECT ETCHING PROCESS

(75) Inventors: William G. En, Sunnyvale; Allison Holbrook; Fei Wang, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/515,321

(22) Filed: Feb. 29, 2000

Related U.S. Application Data

(62) Division of application No. 08/924,569, filed on Sep. 5, 1997, now Pat. No. 6,060,328.

(51) Int. Cl.[7] .............................. G01I 3/46; H01L 21/00
(52) U.S. Cl. ................... 156/345; 204/192.33; 356/425
(58) Field of Search .................. 156/345; 204/192.33; 356/425, 437

(56) References Cited

U.S. PATENT DOCUMENTS

| | | | |
|---|---|---|---|
| 4,289,188 A | * 9/1981 | Mizutani et al. | 156/626 |
| 5,620,556 A | * 9/1981 | Henck | 438/8 |
| 4,832,787 A | 5/1989 | Bondur et al. | 156/643 |
| 5,261,998 A | 11/1993 | Kanetake et al. | 42/89 |
| 5,322,590 A | 6/1994 | Koshimizu | 156/345 |
| 5,387,535 A | 2/1995 | Wilmsmeyer | 437/57 |
| 5,391,520 A | 2/1995 | Chen et al. | 437/200 |
| 5,392,124 A | 2/1995 | Barbee et al. | 356/381 |
| 5,397,433 A | 3/1995 | Gabriel | 156/665 |
| 5,408,488 A | * 4/1995 | Dimitrelis et al. | 156/627 |
| 5,453,400 A | 9/1995 | Abernathey et al. | 437/192 |
| 5,489,797 A | 2/1996 | Chan et al. | 257/382 |
| 5,516,726 A | 5/1996 | Kim et al. | 437/189 |
| 5,521,106 A | 5/1996 | Okabe | 437/41 |
| 5,563,096 A | 10/1996 | Nasr | 437/186 |
| 5,589,415 A | 12/1996 | Blanchard | 437/57 |
| 5,621,232 A | 4/1997 | Ohno | 257/288 |
| 5,621,235 A | 4/1997 | Jeng | 257/384 |
| 5,733,820 A | 3/1998 | Adachi et al. | 438/719 |

\* cited by examiner

Primary Examiner—Felisa Hiteshew

(57) ABSTRACT

An arrangement is provided for collecting, measuring and analyzing at least two specific wavelengths of optical emissions produced while etching a semiconductor wafer in a plasma chamber to determine an optimal endpoint for the etching process. The arrangement includes a sensor for gathering optical emissions, an interface for converting the intensity of optical emissions into corresponding electrical signals, and a controller for determining an optimal endpoint based on the corresponding electrical signals for the two specific wavelengths and other predetermined threshold data.

8 Claims, 3 Drawing Sheets

METHODS AND ARRANGEMENTS FOR DETERMINING AN ENDPOINT FOR AN IN-SITU LOCAL INTERCONNECT ETCHING PROCESS

This application is a divisional of application Ser. No. 08/924,569 now U.S. Pat. No. 6,060,328 filed Sep. 5, 1997.

TECHNICAL FIELD

The present invention relates to semiconductor devices and manufacturing processes, and more particularly to methods and arrangements for providing local interconnections between two or more regions within a semiconductor device.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. To take advantage of increasing number of devices and to form them into one or more circuits, the various devices need to be interconnected.

To accomplish interconnection on such a small scale, a local interconnect is typically used within an integrated circuit to provide an electrical connection between two or more conducting or semi-conducting regions (e.g., active regions of one or more devices). For example, a plurality of transistors can be connected to form an inverting logical circuit using a local interconnect.

The local interconnect is typically a relatively low-resistance material, such as a conductor or doped semiconductor, that is formed to electrically couple the selected regions. For example, in certain arrangements, damascene techniques are used to provide local interconnects made of tungsten (W), or a like conductor, which is deposited within an etched opening, such as via or trench that connects the selected regions together. The use of local interconnects reduces the coupling burden on the subsequently formed higher layers to provide such connectivity, which reduces the overall circuit size and as such tends to increase the circuit's performance.

The formation of the etched openings, in which the local interconnects are formed, requires precise process controls in order to avoid over-etching and/or under-etching within the various layers of the semiconductor wafer. There are at least two conventional methods for determining when to terminate an etching process. One method requires collecting experimental data from test wafers to determine an optimal endpoint. Once the optimal endpoint is determined, then the etching process for subsequent wafers is simply timed to terminate at the specified endpoint. For example, the etching process may be conducted for 20 seconds. However, this timed method is subject to failure due to minor differences in the wafers, the etching tools and/or the etching process parameters.

Another conventional method for determining the endpoint involves monitoring an optical emission from the etching process. This method allows for real-time feedback during the etching process based on differences in the wafer's materials and the reaction between these materials and the etching plasma. By monitoring a specific wavelength from the optical emissions, it is possible to detect transition points wherein the etching plasma begins to react with different materials. This method usually provides better process control when compared to the timed method.

However, in order to take advantage of this optical emission monitoring method, a particular wavelength needs to be identified for the particular wafer structure and/or the etching plasma. Thus, for example, an ideal wavelength would identify when a transition from one material/reaction to another has occurred, or is occurring. Finding such wavelengths, if they exist, is not a trivial task. Assuming a wavelength is found to be emitted during the etching process, it can also be difficult to sense the wavelength and to isolate the wavelength from the optical noise within the etching tool. Thus, false readings of this wavelength can lead to incorrect endpoint determination and therefore under-etching or over-etching of the wafer.

Accordingly, there is a continuing need for more efficient and effective processes for forming local interconnects using damascene techniques. In particular, there is a need or more precise etching process controls for determining the endpoint in forming etched openings using optical emission monitoring methods.

SUMMARY OF THE INVENTION

The methods and arrangements of the present invention provide real-time feedback as to the progress of the local interconnect etching processes using optical emission methods and monitoring arrangements to provide for a more precise determination of one or more endpoints during one or more etching processes thereby preventing under-etching and/or over-etching of the local interconnect etched openings in the semiconductor wafer.

Thus, in accordance with one embodiment of the present invention, there is provided a method for determining at least one endpoint in an etching process. The method includes measuring the intensity of optical emissions having a first wavelength that are produced when a semiconductor wafer is placed in a plasma chamber and subjected to an etching process. The method further includes measuring the intensity of optical emissions having a second different wavelength during the etching process. In accordance with the method, an endpoint for the etching process is determined based on one or more of these measured intensities.

In accordance with certain embodiments of the present invention, the method also includes starting a subsequent etching process in the plasma chamber (i.e., in-situ) after the endpoint, as determined, for the previous etching process has been reached. Thus, in this embodiment, the method includes continued measuring of the intensity of optical emissions of the first and second wavelengths during the subsequent etching process and of the second wavelength during the second etching process, and determining an endpoint for the second etching process based on these measured intensities. In accordance with certain embodiments of the present invention, the first wavelength is either approximately 386 nm or 520 nm and the second wavelength is approximately 439 nm.

The endpoint for either of the etching processes is, in accordance with an embodiment of the present invention, determined by combining the measured intensities to produce a ratio signal that has an improved signal-to-noise ratio over just a single measured intensity signal. The ratio signal is then compared to one or more threshold values/functions or other criteria to determine when to stop the current etching process.

The above stated needs and others are further met by a method for controlling an in-situ local interconnect etching of a semiconductor wafer, in accordance with another embodiment of the present invention. This method includes etching a semiconductor wafer in a plasma chamber with a first etching process, and monitoring the optical emissions from the plasma chamber to determine the intensity of at least two wavelengths of the optical emissions. The method includes stopping the etching with the first etching process based on the intensity of at least one of the two intensities. Next, the method includes etching the semiconductor wafer in the plasma chamber with a second etching process, and stopping the etching with the second etching process based on the intensity of at least one of the two wavelengths.

An arrangement, is provided in accordance with the present invention, for determining at least one endpoint in an etching process within a plasma etching chamber. The arrangement includes a sensor which is configured to measure the intensity of optical emissions of a first wavelength and a second wavelength as emitted from within the plasma chamber during a first etching process of a semiconductor wafer. The arrangement also includes a controller which is coupled to the sensor and configured to determine an endpoint for the first etching process based on at least one of the two measured intensities.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn so as to illustrate the features of the present invention.

Figure 1:
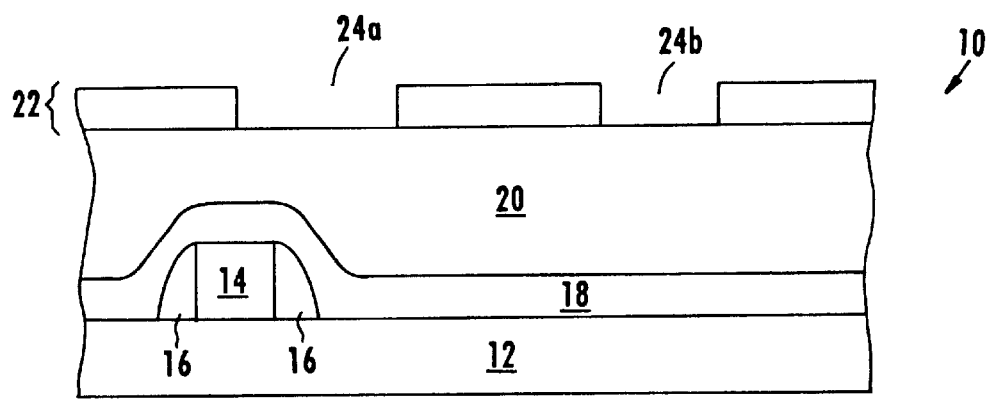
FIG. 1 depicts a cross-section of a portion of a semiconductor wafer, having a dielectric layer and a stop layer, that has been prepared for a local interconnect formation process, in accordance with an embodiment of the present invention.

FIG. 1 depicts a portion 10 of a semiconductor wafer 112 (see FIG. 7) that has been prepared for local interconnect formation. Portion 10 includes a substrate 12 within which at least one semiconductor device, such as, for example, a transistor, has been fabricated using conventional fabrication techniques. A conductive gate or line 14 has been formed above substrate 12. Conductive line 14, for example, in a preferred embodiment is made of a doped polycrystalline silicon that is formed over a thin oxide layer that is grown on the top of substrate 12. Additionally, as is known in the art, silicide, for example, titanium silicide, can be formed on conductive line 14 to enhance the conductivity. On each of the vertical sides of conductive line 14 there is provided a spacer 16. Spacer 16 is typically a dielectric material, such as, for example, oxide. The use and formation of spacers, such as spacer 16, are known in the art.

A conformal stop layer 18 has been deposited over the exposed surfaces of substrate 12, conductive line 14 and spacer 16. Stop layer 18 is typically a thin film of a dielectric material that is different from the material of spacer 16 and any potential dielectric materials within substrate 12 that may be exposed during the formation of the local interconnects. For example, stop layer 18, in accordance with an embodiment of the present invention, is a thin film of silicon nitride. A thicker dielectric layer 20 has been deposited on stop layer 18. Although stop layer 18 and dielectric layer 20 are both dielectric materials, preferably they are different enough in structure that the subsequent in-situ etching process can be advantageously used to etch through dielectric layer 20 while essentially stopping on stop layer 18, thereby avoiding the possibility of etching into substrate 12 and the devices formed therein under normal conditions. Thus, as is known in the art, stop layer 18 provides improved process control in the formation of local interconnects that are formed using damascene techniques. For example, if dielectric layer 20 is a TEOS oxide layer and stop layer 18 is a silicon nitride layer, then a subsequent oxide etching process that exhibits a high selectivity to silicon nitride can be used to remove selected portions of the TEOS oxide layer. Such etching processes and recipes are known in the art and are typically used in conventional etching processes/systems.

A resist mask 22 is formed on dielectric layer 20. Resist mask 22, as is known in the art, defines the local interconnect pattern by providing etch windows, such as etch windows 24a and 24b, through which etching materials are brought in contact with exposed areas of dielectric layer 20. Resist mask 22 is typically formed by patterning a layer of photoresist material, such as, for example, a spin-on organic photoresist material, using conventional lithographic techniques.

Figure 2:
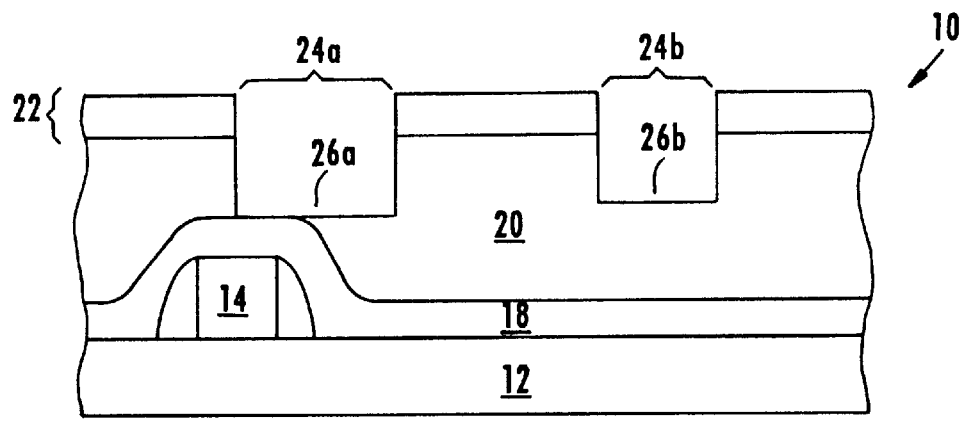
FIG. 2 depicts the cross-section of the portion in FIG. 1 that, as a result of a dielectric etching process, has had selected areas of the dielectric etched away to expose some of the underlying stop layer, in accordance with an embodiment of the present invention.

FIG. 2 depicts the cross-section of the portion in FIG. 1 during a particular stage of an in-situ etching process. As a result of an anisotropic dielectric etching process, selected areas of dielectric layer 20 have been etched away to expose portions of the underlying stop layer 18. As shown, partially etched openings 26a and 26b have been formed by the dielectric etching process through etch windows 24a and 24b, respectively. Partially etched opening 26a, which is situated above a portion of conductive line 14, has exposed part of stop layer 18 on conductive line 14.

Figure 3:
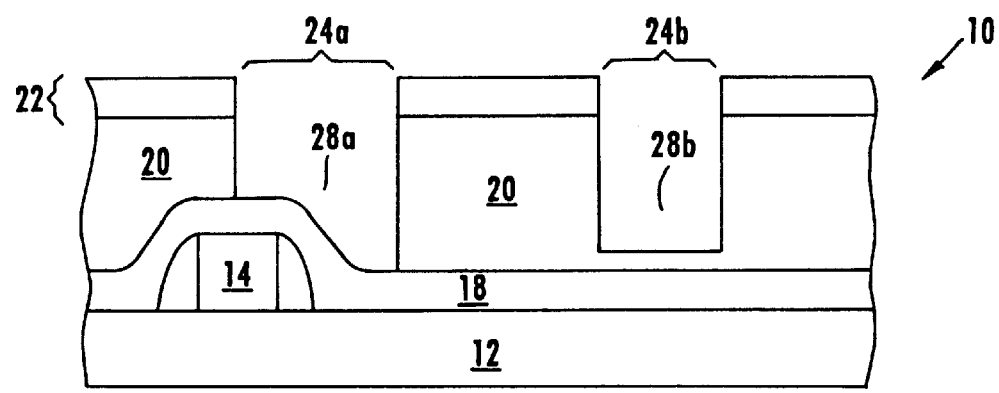
FIG. 3 depicts the cross-section of the portion in FIG. 2 at a later stage in the dielectric etching process after having more of the dielectric layer etched away to further expose more of the underlying stop layer, in accordance with an embodiment of the present invention.

By continuing the in-situ etching process additional dielectric material is removed from dielectric layer 20 through etch windows 24a and 24b, as depicted in FIG. 3. At this stage of the in-situ etching process, the dielectric material of dielectric layer 20 below etch window 24a has been substantially removed (as represented by partially etched opening 28a), to further expose a selected portion of stop layer 18 located below etch window 24a. However, in partially etched opening 28b, which is located below etch window 24b, stop layer 18 has not yet been exposed because there is still additional dielectric material above stop layer 18. By way of example, the illustrated differences in etch rate between the formation of partially etched openings 28a and 28b can be traced to several factors, including, for example, differences in the critical dimension (CD) of the associated etch windows 24a and 24b, differences in the layers/materials and/or topology of portion 10 (or wafer 112), and/or non-uniformities in the etching process across portion 10 (or wafer 112). Regardless of the cause(s) for the different etching rates, at this stage in the in-situ etching process, the dielectric etching is incomplete. Thus, the dielectric etching process is continued until the remaining dielectric material of dielectric layer 20 has been substantially removed below etch window 24b, as depicted in FIG. 4.

Figure 4:
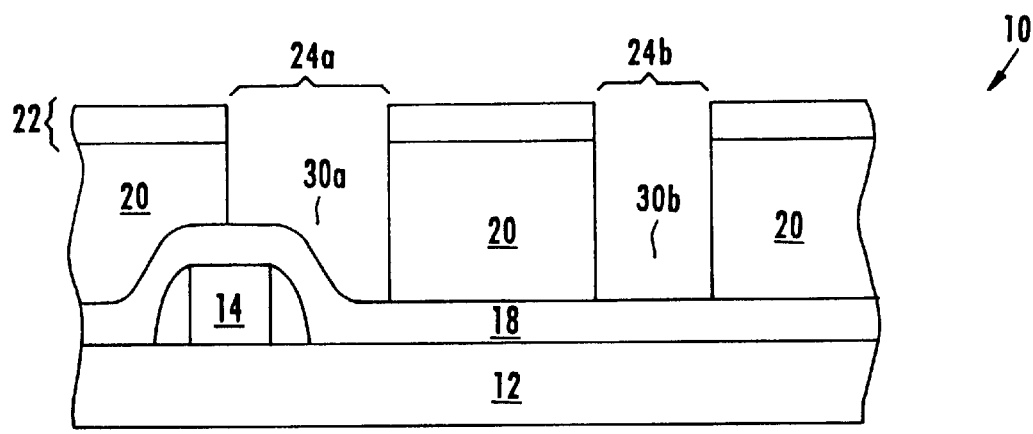
FIG. 4 depicts the cross-section of the portion in FIG. 3 at the end of the dielectric etching process which has left selected areas of the underlying stop layer exposed, in accordance with an embodiment of the present invention.

As shown in FIG. 4, initial etched openings 30a and 30b have been formed by etching through selected portions of dielectric layer 20 to stop layer 18, as defined by etch windows 24a and 24b, respectively. At this stage in the in-situ etching process, the etching recipe is modified (or switched) to etch the dielectric material in stop layer 18, while exhibiting a high selectivity to the dielectric material of dielectric layer 20 and spacer 16. For example, as known in the art, the etching recipe or chemistry can be modified (or switched) by changing the types and/or proportions of the etchant gas(es) or mixture combinations. Additionally, as is also known in the art, different etching processes often require different temperatures (of portion 10) to be maintained, different pressures to be maintained within the etching reactor chamber, and/or different power levels to be supplied to the reactor chamber.

Figure 5:
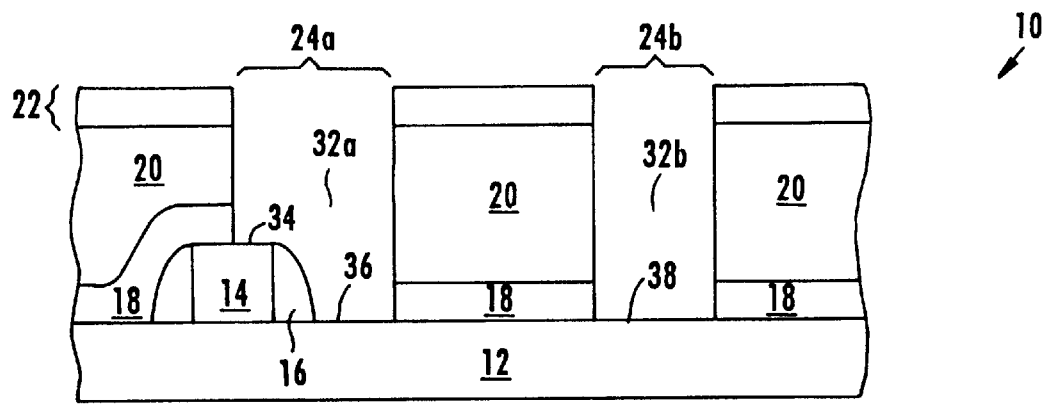
FIG. 5 depicts the cross-section of the portion in FIG. 4 having etched openings after having the exposed areas of the stop layer etched away during a stop layer etching process conducted in-situ with the dielectric etching process, in accordance with an embodiment of the present invention.

FIG. 5 depicts the cross-section of the portion in FIG. 4 after the exposed/selected areas of stop layer 18 have been removed. As shown, at this stage in the in-situ etching process, etched openings 32a and 32b have been created below etch windows 24a and 24b, respectively. Etched opening 32a, therefore, extends through dielectric layer 20 and stop layer 18 to expose a top surface 34 of conductive line 14, spacer 16, and a contact area 36 of substrate 12. Similarly, etched opening 32b extends through dielectric layer 20 and stop layer 18 to expose contact area 38 of substrate 12. Contact areas 36 and 38, in accordance with an embodiment of the present invention, represent active and/or conductive and/or semiconductive regions of various devices formed within substrate 12, such as, for example, source/drain regions of field effect transistors.

Figure 6:
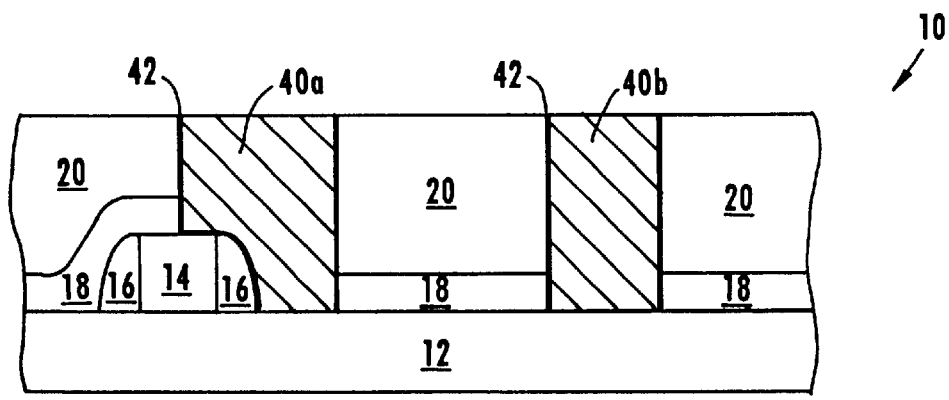
FIG. 6 depicts the cross-section of the portion in FIG. 5 after having local interconnects formed within the etched openings in FIG. 5, in accordance with an embodiment of the present invention.

To complete the formation of the local interconnects 40a and 40b, respectively, as depicted in FIG. 6, resist mask 22 is removed and etched openings 32a and 32b are filled with one or more conductive materials. For example, resist mask 22 in certain embodiments is removed in-situ using a conventional plasma etching recipe that etches or ashes away the resist material. In other embodiments, resist mask 22 is removed using conventional wet stripping techniques.

Once resist mask 22 has been removed, in accordance with an embodiment of the present invention, a thin conductive glue layer 42 is deposited over selected/exposed surfaces of portion 10 using conventional deposition and/or sputtering techniques. For example, a thin film of titanium and titanium nitride (Ti/TiN) is sputtered into etched openings 32a and 32b to act as glue layer 42, in accordance with certain embodiments of the present invention. Next, a thicker layer of tungsten (W) is deposited on glue layer 42 and within etched openings 32a and 32b. For example, the layer of tungsten can be deposited using conventional chemical vapor deposition (CVD) techniques or enhanced CVD techniques. The layer of tungsten is then planarized down to form the significantly level local interconnects 40a and 40b in FIG. 6. For example, the planarization, in accordance with an embodiment of the present invention, includes using conventional chemical-mechanical polishing (CMP) techniques to remove portions of the layer of tungsten and glue layer 42 located outside of etched openings 32a and 32b. As is known in the art, the tungsten of local interconnects 40a and 40b tends to exhibit better adhesion within etched areas 32a and 32b, and/or improved conductivity due to the inclusion of glue layer 42.

Thus, as depicted in the exemplary portions in FIGS. 1 through 6 and described above, the formation of local interconnects requires precise control over the etching process to form etched openings 32a and 32b which are the right shape, size and depth. If an etching process is stopped too early (e.g., under-etching), then unwanted material will remain. If an etching process is continued for too long (e.g., over-etching), then additional material is removed. In either situation one or more of the resulting local interconnects that are formed may malfunction causing the integrated circuit that is formed therewith to also fail. Thus, there is a need to precisely control the etching processes used in forming the local interconnects so as to insure that the resulting integrated circuit functions properly.

This need is met by the methods and arrangements of the present invention. As discussed above and illustrated in FIGS. 1 through 6, the present invention includes an in-situ etching process that allows for the etched openings to be created within one etching reactor. For example, the in-situ deposition process includes, in accordance with an embodiment of the present invention, a dielectric etching process that anisotropically etches through dielectric layer 20 and stops at stop layer 18, and a stop layer etching process that etches through stop layer 18 and stops at the underlying surfaces of substrate 12 and conductive line 14. In the past, the starting and stopping of these two etching processes has been determined by timing each of the processes based on experimental data from previous etching operations, for example, studies of the etching rate for a given wafer/material and/or resist pattern. Thus, for example, the dielectric etching process in a conventional local interconnect etching process lasts for a finite process period (e.g., 30 seconds) based on previous test/experimental results. Determining this process period can be difficult and expensive. Moreover, given slight variations in the process parameters, systems, and wafers, the conventional etching processes that use a timed process period are subject to failure from time to time.

Rather than rely on a timed process period for the etching processes in the in-situ etching process, the methods and arrangements of the present invention monitor optical emissions from the etching process to determine when to start and stop a particular etching process. Thus, for example, based on an analysis of the optical emissions from the etching reaction in a plasma etching system, during a dielectric layer etching process, there is provided a determinable point at which initial etched openings 30a and 30b have been formed. At or about this point, the dielectric etching process is then terminated and the stop layer etching process is started. Likewise, there is also a determinable point for terminating the stop layer etching process based on changes in the optical emissions as etched openings 32a and 32b are completed. Thus, the present invention provides methods and arrangements for determining process endpoints that are flexible and closely coupled to the on-going in-situ etching process, the process recipe and the semiconductor wafer/materials being etched. As a result, the etching of trenches, contacts and vias for use in forming local interconnects is precisely controlled to prevent either under or over-etching of the semiconductor wafer.

Figure 7:
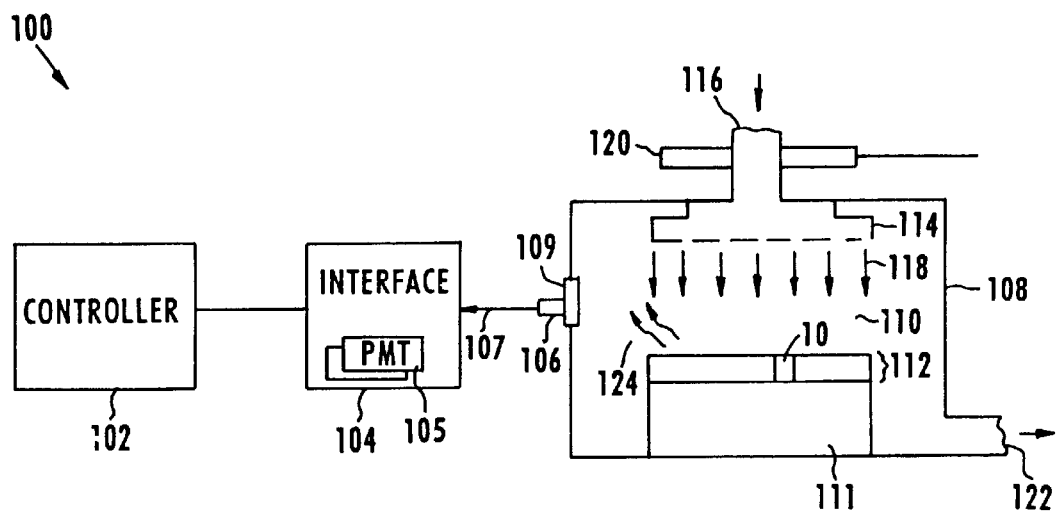
FIG. 7 depicts a block diagram of an arrangement for an in-situ etching process for etching a dielectric layer and an underlying stop layer, as in FIGS. 1 through 5, in accordance with an embodiment of the present invention.

FIG. 7 depicts a block diagram of an arrangement 100 for an in-situ etching process for etching a dielectric layer and an underlying stop layer, as in FIGS. 1 through 5, in accordance with an embodiment of the present invention. Arrangement 100 includes a controller 102, an interface 104, a sensor 106, and a plasma reactor 108. Within plasma reactor 108, there is a chamber 110 that is configured for etching one or more semiconductor wafers, or other similar work products. As shown, within chamber 110 there is provided a chuck 111 for holding wafer 112 during the in-situ etching process. A showerhead 114 is provided above wafer 112, within chamber 110, for providing one or more gases within chamber 110 for use in striking a plasma 118 and etching materials in wafer 112. The gases are provided to showerhead 114 through gas inlet 116. The plasma, in this exemplary embodiment, is energized by a powered electrode 120, as is known in the art. Additionally, the pressure within chamber 110 is maintained, and etched materials and related process gases are removed, by a turbo pump or like device through exhaust port 122.

Plasma 118 causes selected and exposed portions of wafer 112 to be etched during the in-situ etching process. The etching reaction produces optical emissions 124. As, illustrated, some of the optical emissions 124 travel through chamber 110 and pass through a window 109 to exit chamber 110. In accordance with an embodiment of the present invention, an optical sensor 106 is arranged to collect or otherwise sample at least some of the optical emissions 124 that pass through window 109. These collected optical emissions are then converted into corresponding electrical signals that can be analyzed to determine the intensity of at least two different wavelengths in optical emissions 124.

Thus, for example, in accordance with an embodiment of the present invention, the collected optical emissions are provided to interface 104, through a fiber optic cable 107. Interface 104 includes sensors, such as, for example, one or more photo-multiplier tubes (PMTs) 105, that are configured to output a corresponding electrical signal based on a received optical emission having one or more specific wavelengths. For example, interface 104, in certain embodiments of the present invention, includes a first PMT 105 that is responsive to a first specific wavelength (or a first finite range of wavelengths) and outputs a first voltage signal that is proportional to the intensity of the collected optical emissions 124 having the first specific wavelength (or first finite range of wavelengths). Interface 104, in this example, further includes a second PMT 105 that is responsive to a second specific wavelength (or a second finite range of wavelengths) and outputs a second voltage signal that is proportional to the intensity of the collected optical emissions 124 having the second specific wavelength (or second finite range of wavelengths). Thus, in this embodiment, interface 104 essentially monitors or detects the presence of particular wavelengths in optical emissions 124 and provides one or more corresponding electrical signals to controller 102.

In yet another embodiment of the present invention, interface 104 and/or sensor 106 are part of an optical emission spectrometer, which for example combines a narrow bandpass filter and a photodiode in an arrangement that continuously monitors the intensity of wavelengths of the optical emissions 124 associated with the etching reaction.

Controller 102, in accordance with an embodiment of the present invention, compares or otherwise analyzes the electrical signals received from interface 104 to determine when to start and terminate the dielectric and stop layer etching processes that are conducted as part of the in-situ etching process. As such, in accordance with certain embodiments, controller 102 is a computer, having a processor and an associated memory, that is configured to analyze the electrical signals received from interface 104 to determine one or more endpoints. In accordance with other embodiments, controller 102 contains logic that is configured to determine one or more endpoints based on the electrical signals from interface 104. In accordance with either of these two exemplary embodiments, controller 102 is further configured to output one or more indicators to an operator and/or an operational terminal/controller for reporting on the current etching process and/or for starting and/or terminating an etching process.

Figure 8:
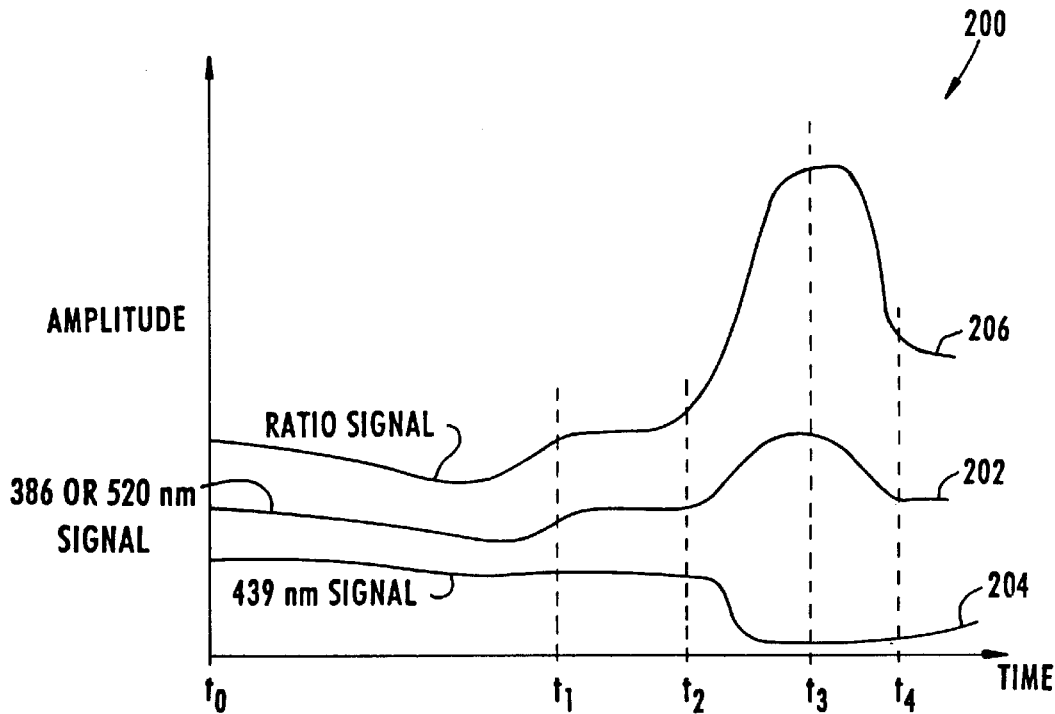
FIG. 8 depicts an illustrative timeline graph corresponding to the intensity of specific wavelengths in the optical emissions resulting from the in-situ etching process as depicted in the portions in FIGS. 1 through 5 and as conducted in the arrangement in FIG. 7.

FIG. 8 depicts an illustrative timeline graph 200, in accordance with an embodiment of the present invention, of the electrical signals corresponding to an intensity of specific wavelengths in optical emissions 124 during the in-situ etching process as applied to portions 10 in FIGS. 1 through 5 and as conducted via arrangement 100 in FIG. 7.

Graph 200 depicts three electrical signals. One electrical signal is a 386 nm signal 202 (as identified) that represents the intensity of optical emissions 124 having a wavelength of approximately 386 nm, versus time. Alternatively, in accordance with certain embodiments of the present invention, signal 202 is a 520 nm signal that represents the intensity of optical emissions 124 having a wavelength of approximately 520 nm. Another electrical signal is a 439 nm signal 204 (as identified) that represents the intensity of optical emissions 124 having a wavelength of approximately 439 nm.

The uppermost electrical signal is a ratio signal 206 (as identified) which, in accordance with an embodiment of the present invention, is a function of, or represents a ratio of, the intensities of wavelengths in optical emissions 124 having wavelengths of 386 nm and 439 nm wavelengths. Alternatively, ratio signal 206 is a function of, or represents a ratio of, the intensities of wavelengths in optical emissions 124 having wavelengths of 520 nm and 439 nm. By way of example, ratio signal 206 in accordance with a preferred embodiment is produced by dividing signal 202 (i.e., the intensity of 386 nm or 520 nm optical emissions 124) by signal 204 (i.e., the intensity of 439 nm optical emissions 124).

Referring to arrangement 100 in FIG. 7, ratio signal 206 is produced in either interface 104 or in controller 102. Ratio signal 206, as depicted, has a similar shape to 386 nm signal 202 from time $t_0$ to time $t_4$ with the notable exception of between time $t_2$ and time $t_3$. Since the shape of signal 204 changes (i.e., the amplitude drops) between time $t_2$ and time $t_3$, this causes ratio signal 206 to sharply increase in amplitude as a result of the functional relationship between signals 202 and 204 in producing ratio signal 206.

There are several advantageous to analyzing ratio signal 206 rather than just a single signal, such as signal 202. One advantage is that by dividing signal 202 by signal 204, the signal-to-noise ratio is increased in the resulting ratio signal 206 because a significant amount of the noise in the signal 202 is also present in signal 204 and as such this noise is cancelled by the division of signal 202 by signal 204. As a result, ratio signal 206 tends to have less noise.

Another advantage to analyzing ratio signal 206 is that by selecting certain signals (i.e., wavelengths) various characteristics of the etching process, as represented by changes in amplitude of ratio signal 206, can be enhanced to increase detection. For example, the 386 nm (or 520 nm) signal 202 contains important information regarding the etching process (e.g., emissions from the etching product and associated reactive species, such as CN (cyanide)). Unfortunately, the information, which is reflected by changes in the amplitude of the electrical signal (i.e., intensity of the optical emission), is at times difficult to detect due to noise and other spurious events that affect the shape of signal 202. Fortunately, in accordance with an embodiment of the present invention, the 439 nm wavelength signal also reflects information regarding the on-going etching process, and as such is combined with signal 202 in a manner that enhances the detection of the information. Thus, by dividing signal 202 by signal 204, the drop in signal 204 between times $t_2$ and $t_3$ enhances (increases) the rise in signal 206 associated with the rise in signal 202 between times $t_2$ and $t_3$.

The shape of ratio signal 206 contains important information in determining when to start and stop an etching process. For example, in accordance with an embodiment of the present invention, at time $t_0$ the in-situ etching process begins by starting a dielectric etching process as described above. The dielectric etching process continues to time $t_1$. At approximately time $t_1$, ratio signal 206 increases as a result of having etched through a portion of dielectric layer 20 to expose a portion of stop layer 18, as depicted in FIG. 2. The dielectric etching process is continued, and at approximately time $t_2$ there is a further increase in the amplitude of ratio signal 206 that corresponds to FIG. 3, wherein more of dielectric layer 20 has been removed and more of stop layer 18 is exposed. Ratio signal 206 then begins leveling-off at approximately time $t_3$, which corresponds to FIG. 4, wherein the remaining portions of dielectric layer 20, for example below etch window 24b, have been removed to expose stop layer 18.

As a result, the dielectric etching process is stopped at approximately time $t_3$ when controller 102 detects this leveling-off in the amplitude of ratio signal 206. The in-situ etching process, in accordance with the present invention, then switches to a stop layer etching process at approximately time $t_3$. The stop layer etching process is continued until approximately time $t_4$, wherein the selected/exposed areas of stop layer 18 have been etched away as depicted, for example, in FIG. 5. Notice that at approximately time $t_4$, ratio signal 206 begins to level-off again following a more rapid decrease in amplitude during the stop layer etching process from time $t_3$ to time $t_4$. When this leveling-off, or more gradual decrease, is detected by controller 102, then the stop layer etching process is halted. For example, in accordance with certain embodiments of the present invention, the amplitude of ratio signal 206 is compared within controller 102 to a preset threshold value, or to other threshold value(s) generated via a predefined function. Thus, when the threshold value(s) or other similar amplitude/shape/timing criteria has been reached or otherwise satisfied by ratio signal 206, then an endpoint has been determined.

Thus, the methods and arrangements of the present invention provide real-time feedback as to the progress of the etching processes and determine optimal endpoints for each of the etching processes to prevent under-etching or over-etching of the semiconductor wafer 112.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. An arrangement for determining endpoints in an etching process within a plasma etching chamber, the arrangement comprising:

a sensor configured to measure a first intensity of optical emissions having a first wavelength, and a second intensity of optical emissions having a second wavelength as emitted from within the plasma chamber during a first etching process and a subsequent second etching process of a semiconductor wafer; and a controller coupled to the sensor and configured to determine an endpoint for the first etching process based on a ratio signal generated from the first intensity and the second intensity, and stop the first etching process at the endpoint for the first etching process, and wherein the controller is further configured to start the second etching process after the endpoint for the first etching process, and the controller is further configured to determine an endpoint for the second etching process based on the ratio signal of the first intensity and the second intensity, and stop the second etching process at the endpoint for the second etching process.

2. The arrangement as recited in claim 1, wherein the first wavelength is selected from a set of wavelengths including approximately 386 nm and approximately 520 nm wavelengths.

3. The arrangement as recited in claim 1, wherein the second wavelength is approximately 439 nm.

4. The arrangement as recited in claim 1, further comprising an interface coupled between the sensor and the controller and configured to sample the optical emissions as received from the sensor, and output, to the controller, a first intensity signal and a second intensity signal, wherein the first intensity signal is an electrical signal that is proportional to the first intensity and the second intensity signal is an electrical signal that is proportional to the second intensity.

5. The arrangement as recited in claim 4, wherein the ratio signal is calculated using the first and second intensity signals.

6. The arrangement as recited in claim 5, wherein the ratio signal is proportional to the first intensity signal divided by the second intensity signal.

7. The arrangement as recited in claim 5, wherein the controller is configured to determine the endpoint for the first etching process by comparing the ratio signal to at least one first etching process threshold level.

8. The arrangement as recited in claim 5, wherein the controller is configured to determine the endpoint for the second etching process by comparing the ratio signal to at least one second etching process threshold level.

* * * * *